US009668361B2

(12) United States Patent
Kajihara

(10) Patent No.: US 9,668,361 B2
(45) Date of Patent: May 30, 2017

(54) PRINTED WIRING BOARD

(71) Applicant: IBIDEN CO., LTD., Ogaki (JP)

(72) Inventor: Kazuki Kajihara, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 315 days.

(21) Appl. No.: 14/261,804

(22) Filed: Apr. 25, 2014

(65) Prior Publication Data

US 2014/0338965 A1 Nov. 20, 2014

(30) Foreign Application Priority Data

May 15, 2013 (JP) ................................ 2013-103299

(51) Int. Cl.
*H05K 1/11* (2006.01)
*H05K 3/42* (2006.01)

(52) U.S. Cl.
CPC ... *H05K 3/426* (2013.01); *H05K 2201/09563* (2013.01); *H05K 2203/072* (2013.01); *H05K 2203/0723* (2013.01)

(58) Field of Classification Search
CPC . H05K 1/09; H05K 1/11; H05K 1/115; H05K 3/00; H05K 3/40; H05K 3/421; H05K 3/423; H05K 3/426; H05K 3/427; H05K 3/0094; H05K 2203/1492; H05K 3/4647; H05K 3/4655; H05K 2201/0959; H05K 2201/09563; H05K 2203/072; H05K 2203/0723; H05K 2203/1476; H01L 21/486; H01L 24/97; Y10T 29/49126; Y10T 29/49165

USPC .................. 29/852, 830; 174/264, 266, 261; 205/125, 95
See application file for complete search history.

(56) References Cited

U.S. PATENT DOCUMENTS

2009/0119915 A1* 5/2009 Usui ..................... H01L 21/486
29/852
2011/0120762 A1* 5/2011 Kawai ................... H05K 3/423
174/264

FOREIGN PATENT DOCUMENTS

JP 2004311919 A * 11/2004
JP 2005-093934 4/2005

* cited by examiner

*Primary Examiner* — Timothy Thompson
*Assistant Examiner* — Guillermo Egoavil
(74) *Attorney, Agent, or Firm* — Oblon, McClelland, Maier & Neustadt, L.L.P.

(57) ABSTRACT

A printed wiring board includes an insulative resin substrate having a penetrating hole, a first conductive layer formed on first surface of the substrate, a second conductive layer formed on second surface of the substrate, and a through-hole conductor formed in the hole such that the conductor is connecting the first and second conductive layers. The conductor has a seed layer on inner wall of the hole, a laminated plated layer on the seed layer and a filled plated layer on the laminated layer, the laminated layer is formed such that the laminated layer is closing center portion of the hole and forming recess at end of the hole, the filled layer is formed such that the filled layer is filling the recess, and the laminated layer includes multiple electrolytic plated films laminated along the seed layer and each having thickness which is less at edge than at center.

20 Claims, 4 Drawing Sheets

PRINTED WIRING BOARD

CROSS-REFERENCE TO RELATED APPLICATIONS

The present application is based upon and claims the benefit of priority to Japanese Patent Application No. 2013-103299, filed May 15, 2013, the entire contents of which are incorporated herein by reference.

BACKGROUND OF THE INVENTION

Field of the Invention

The present invention relates to a printed wiring board with a through-hole conductor.

Description of Background Art

JP 2005-093934 A describes forming a cylindrical through hole in a resin substrate, forming a thin metal layer on the inner wall surface of the through hole, and filling plating in the through hole with electrolytic plating. The metal deposition speed of the electrolytic plating solution in JP 2005-093934 A is faster in the through hole than on a resin substrate surface. In JP 2005-093934 A, a predetermined portion inside the through hole is closed by the plating. The entire contents of this publication are incorporated herein by reference.

SUMMARY OF THE INVENTION

According to one aspect of the present invention, a printed wiring board includes an insulative resin substrate having a penetrating hole, a first conductive layer formed on a first surface of the insulative resin substrate, a second conductive layer formed on a second surface of the insulative resin substrate on the opposite side with respect to the first surface of the insulative resin substrate, and a through-hole conductor formed in the penetrating hole of the insulative resin substrate such that the through-hole conductor is connecting the first conductive layer and the second conductive layer. The through-hole conductor has a seed layer formed on an inner wall of the penetrating hole, a laminated electrolytic plated layer formed on the seed layer and a filled electrolytic plated layer formed on the laminated electrolytic plated layer, the laminated electrolytic plated layer is formed in the penetrating hole such that the laminated electrolytic plated layer is closing a center portion of the penetrating hole and forming a recessed portion at an end portion of the penetrating hole, the filled electrolytic plated layer is formed in the penetrating hole such that the filled electrolytic plated layer is filling the recessed portion of the penetrating hole, and the laminated electrolytic plated layer includes multiple electrolytic plated films such that the electrolytic plated films are laminated along the seed layer and that each of the electrolytic plated films has a thickness which is less at an edge portion than at a center portion.

According to another aspect of the present invention, a method for manufacturing a printed wiring board includes forming a penetrating hole through an insulative resin substrate, forming a first conductive layer on a first surface of the insulative resin substrate, forming a second conductive layer on a second surface of the insulative resin substrate on the opposite side with respect to the first surface of the insulative resin substrate, and forming a through-hole conductor in the penetrating hole of the insulative resin substrate such that the through-hole conductor connects the first conductive layer and the second conductive layer. The forming of the through-hole conductor includes forming a seed layer on an inner wall of the penetrating hole, forming a laminated electrolytic plated layer on the seed layer and forming a filled electrolytic plated layer on the laminated electrolytic plated layer, the laminated electrolytic plated layer is formed in the penetrating hole such that the laminated electrolytic plated layer is closing a center portion of the penetrating hole and forming a recessed portion at an end portion of the penetrating hole, the filled electrolytic plated layer is formed in the penetrating hole such that the filled electrolytic plated layer is filling the recessed portion of the penetrating hole, the forming of the laminated electrolytic plated layer includes forming multiple electrolytic plated films such that the electrolytic plated films are laminated along the seed layer and that each of the electrolytic plated films has a thickness which is less at an edge portion than at a center portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
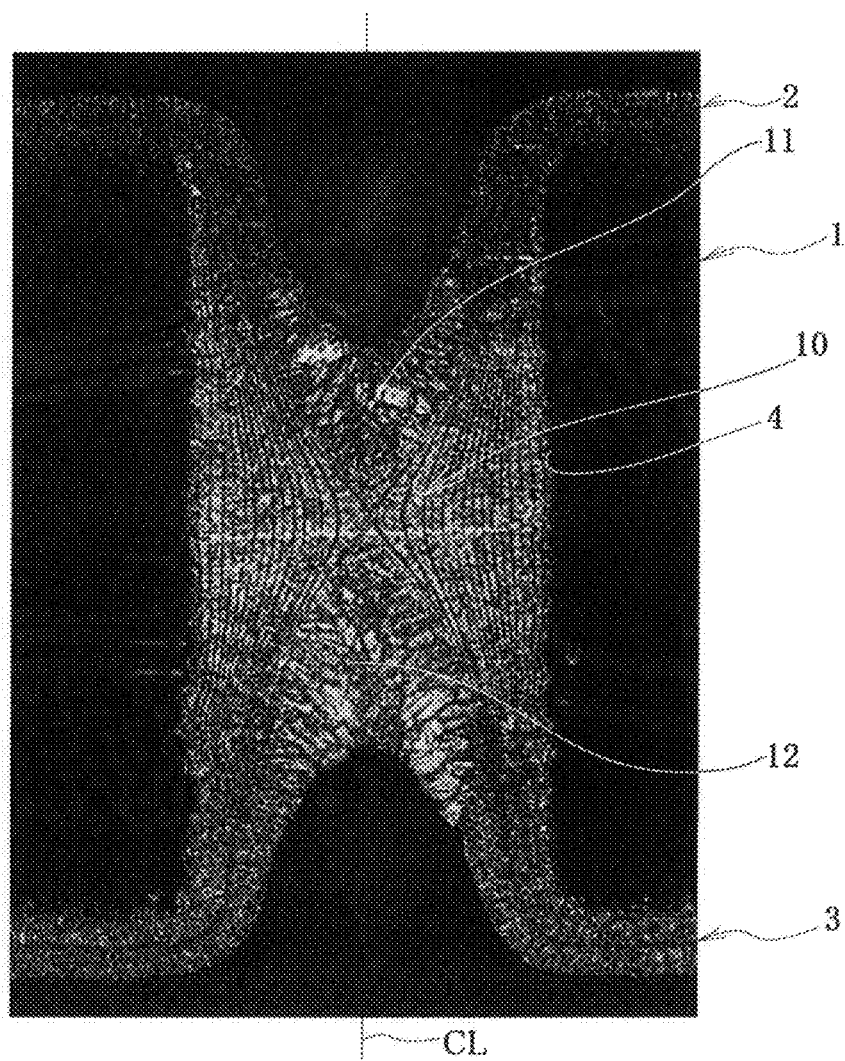
FIG. 1 is an image taken by electron microscope showing an enlarged cross-sectional view of a through-hole conductor in a printed wiring board according to an embodiment of the present invention.

The embodiments will now be described with reference to the accompanying drawings, wherein like reference numerals designate corresponding or identical elements throughout the various drawings.

Figure 2:
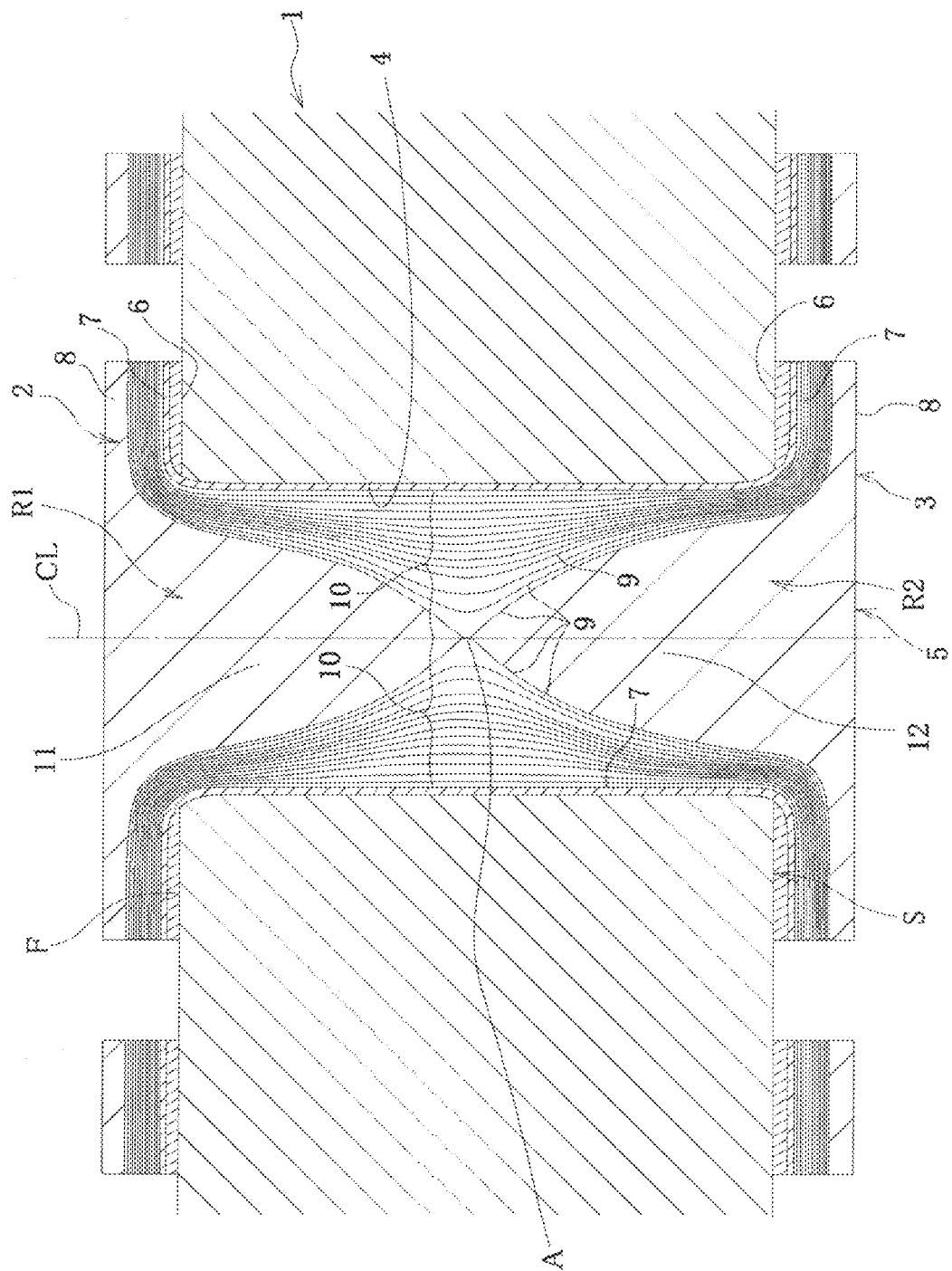
FIG. 2 is a view schematically illustrating a cross-sectional view of the through-hole conductor in a printed wiring board according to the embodiment.

FIG. 1 is an image taken by an electron microscope showing an enlarged cross-sectional view of a through-hole conductor of a printed wiring board according to the present embodiment. FIG. 2 is a view schematically illustrating a cross-sectional view of the through-hole conductor of a printed wiring board according to the present embodiment.

As shown in FIG. 2, a printed wiring board of the present embodiment has insulative resin substrate 1 having first surface (F) and second surface (S) opposite the first surface; first conductive layer 2 formed on first surface (F) of insulative resin substrate 1; second conductive layer 3 formed on second surface (S) of insulative resin substrate 1; and through-hole conductor 5 penetrating through insulative resin substrate 1 and connecting first conductive layer 2 and second conductive layer 3. Through-hole conductor 5 is formed in penetrating hole 4 in insulative resin substrate 1.

Insulative resin substrate 1 is made of cured resin and reinforcing material such as glass cloth. First and second conductive layers (2, 3) each include multiple conductive circuits, and are each made up of metal foil (copper foil) 6 laminated on insulative resin substrate 1, electroless plated layer (electroless copper-plated layer) 7 formed on metal foil 6, laminated electrolytic plated layer 10 formed on electroless plated layer 7, and filled electrolytic plated layers (11, 12) formed on laminated electrolytic plated layer 10.

Penetrating hole 4 (penetrating hole for a through-hole conductor) in insulative resin substrate 1 is formed as a straight hole. Through-hole conductor 5 is made up of electroless plated layer (electroless copper-plated layer) 7 formed on the inner wall surface of penetrating hole 4, and electrolytic plated layer (electrolytic copper-plated layer) 8 formed on electroless plated layer 7. Penetrating hole 4 is filled with the electrolytic plated layer.

Electrolytic plated layer 8 of through-hole conductor 5 has multiple layers of electrolytic plated film 9 that are laminated on electroless plated layer 7 layer by layer along electroless plated layer 7. Multiple layers of the electrolytic plated film are formed along the inner wall of penetrating hole 4. Laminated electrolytic plated layer 10 is made up of multiple layers of electrolytic plated film 9. FIG. 2 shows 14 layers of electrolytic plated film 9.

The thickness of each layer in electrolytic plated film 9 is greater at the center portion in a thickness direction of insulative resin substrate 1 (center portion (C) of penetrating hole 4) than near the entrance portions of penetrating hole 4 (edges (E) of penetrating hole 4). Thus, as shown in FIGS. 1 and 2, layers of electrolytic plated film 9 that form the laminated electrolytic plated layer make contact with each other at a predetermined portion near the center in a cross-sectional direction (center portion (C) of penetrating hole 4). The portions of electrolytic plated film 9 touch each other. The approximate center portion (C) of penetrating hole 4 is closed by laminated electrolytic plated layer 10. Accordingly, in penetrating hole 4, first recessed portion (R1) is formed on the first-surface (F) side and second recessed portion (R2) is formed on the second-surface (S) side.

Furthermore, electrolytic plated layer 8 which forms through-hole conductor 5 has first filled electrolytic plated layer 11 filled in first recessed portion (R1) and second filled electrolytic plated layer 12 filled in second recessed portion (R2). First recessed portion (R1) and second recessed portion (R2) are not yet fully filled in FIG. 1. The vicinity of the entrance portion of penetrating hole 4 is closer to first surface (F) or second surface (S) of the insulative resin substrate, and the center portion in a thickness direction is farther from first surface (F) or second surface (S) of the insulative resin substrate.

Figure 3:
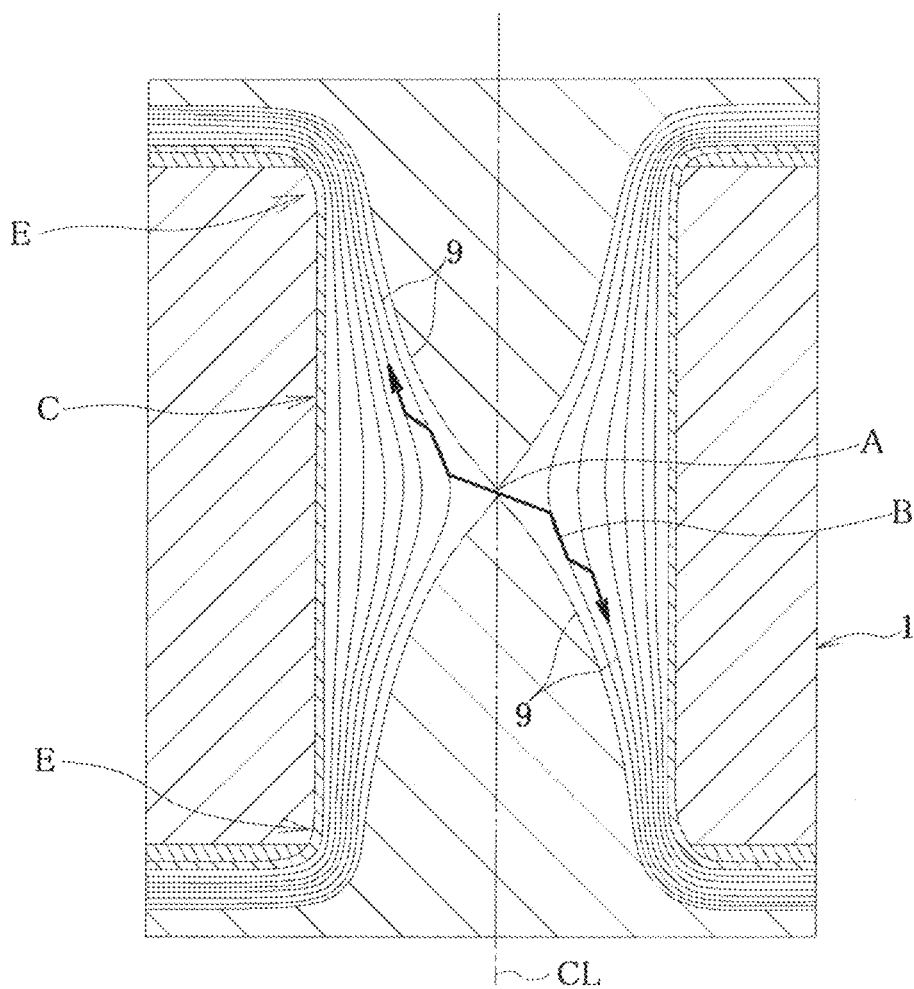
FIG. 3 is a view illustrating the progressive direction of stress at a cross section of the through-hole conductor in a printed wiring board according to the embodiment.

In a printed wiring board of the present embodiment, the laminated electrolytic plated layer that closes the penetrating hole is made up of multiple layers of electrolytic plated film 9. The tips of laminated electrolytic plated layer 10, which grows from the inner wall of the penetrating hole toward the center axis of the penetrating hole, make contact with each other, or the tips of laminated electrolytic plated layer 10 touch each other. The contact portion or touching portion is junction (A) (see FIG. 2). In the present embodiment, laminated electrolytic plated layer 10 is formed by layers of electrolytic plated film 9. Thus, even when stress is concentrated in junction (A) of the laminated electrolytic plated layer, it is thought that the stress is unlikely to progress straight to the inner wall of the penetrating hole. Namely, the stress is thought to be mitigated along the interfaces of the layers of electrolytic plated film 9 as shown in FIG. 3. FIG. 3 shows assumed progressive direction (B) of stress. Therefore, the connection reliability of a through-hole conductor is high according to the embodiment.

Figure 4:
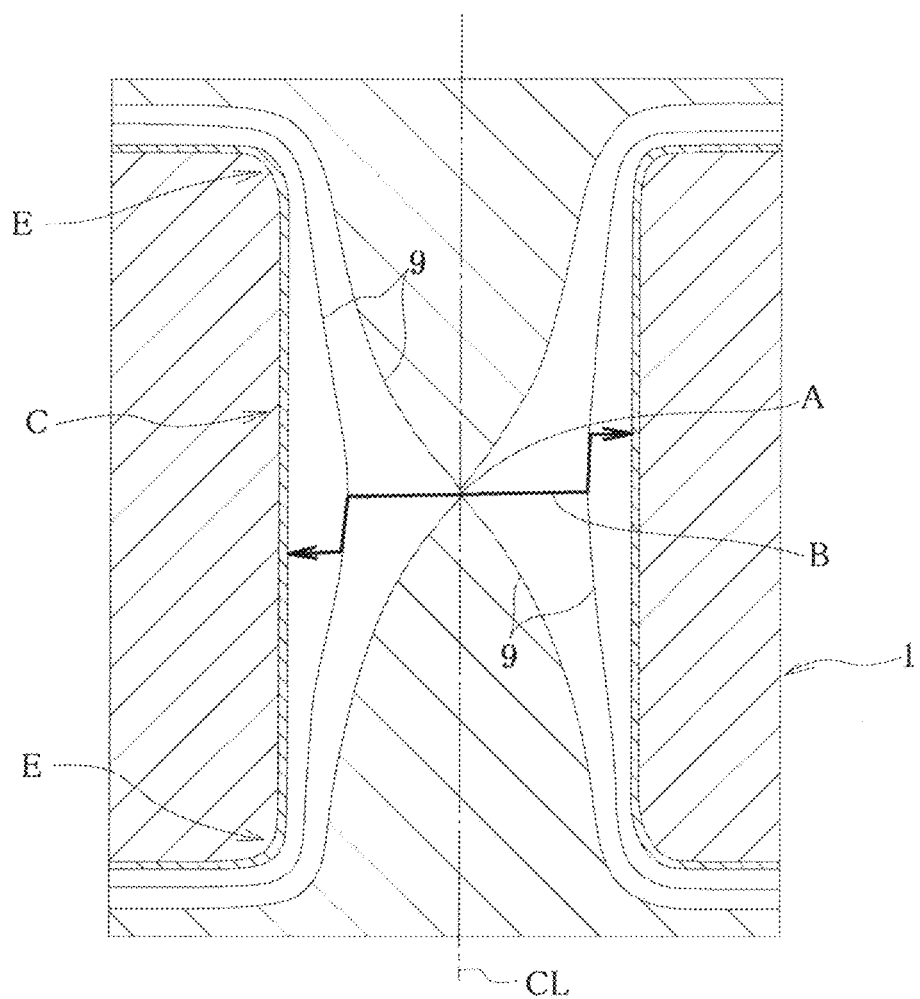
FIG. 4 is a view illustrating the progressive direction of stress at a cross section of the through-hole conductor in a printed wiring board according to a reference example.

FIG. 4 shows a reference example. When electrolytic plated film 9 is double layered and greater stress is exerted, foreseeable progressive direction (B) is shown in FIG. 4.

Even if there are only two electrolytic plated films, it is thought that stress is unlikely to progress straight to the inner wall of the penetrating hole. Thus, cracking is less likely to occur in the through-hole conductor. However, to avoid defects, the number of layers of electrolytic plated film 9 is preferred to be seven or greater. When the number of layers is seven or greater, stress is less likely to reach the inner wall of the penetrating hole. Thus, cracking is less likely to occur in the through-hole conductor. If the number of layers is 21 or greater, significant change in the effect is not observed. For example, the effect can be verified by comparing the resistance values of the through-hole conductor before and after a heat cycle.

Also, the through-hole conductor is made up of laminated electrolytic plated layer 10 and first and second filled electrolytic plated layers (11, 12). Especially, since laminated electrolytic plated layer 10 is formed by laminating multiple layers of electrolytic plated film 9, a void is unlikely to occur in the through-hole conductor. Therefore, even in a usage state where a significant amount of voltage or current is applied onto through-hole conductor 5, problems caused by an increase in current density will be prevented.

The printed wiring board of the present embodiment can be used as the core substrate of a buildup wiring board shown in JP 2000-101243 A. A method for manufacturing the buildup wiring board is described in JP 2000-101243 A. The entire contents of this publication are incorporated herein by reference.

Steps for manufacturing a printed wiring board of the present embodiment are described below.

(1) A commercially available double-sided copper-clad laminate is prepared as a starting material. The double-sided copper-clad laminate prepared as insulative resin substrate 1 has an approximate thickness of 100 μm. Penetrating hole 4 is formed by a drill in the double-sided copper-clad laminate. The diameter of the penetrating hole is 80 μm.

(2) Electroless plated layer 7 as a seed layer is formed by performing electroless copper plating on copper foil 6 on both surfaces of the double-sided copper-clad laminate and on the inner wall of penetrating hole 4. The thickness of electroless plated layer 7 is 0.3 to 3.0 μm.

An example of the electroless plating solution and plating conditions are shown below.

Electroless Copper Plating Solution

| | |
|---|---|
| $NiSO_4$ | 0.003 mol/L |
| tartaric acid | 0.200 mol/L |
| copper sulfate | 0.030 mol/L |
| HCHO | 0.050 mol/L |
| NaOH | 0.100 mol/L |
| α,α'-bipyridyl | 100 mg/L |
| polyethylene glycol | 0.10 g/L |

Conditions for Electroless Copper Plating

| | |
|---|---|
| time | 40 minutes |
| temperature | 34° C. |

(3) Next, the first layer of electrolytic plated film 9 (first electrolytic plated layer) is formed. The thickness of the first-layer electrolytic plated film 9 at the edge (E) of penetrating hole 4 is less than the thickness of the first-layer electrolytic plated film 9 at the center portion (C) of penetrating hole 4. When the first layer of electrolytic plated film 9 is formed, the substrate with the first layer of electrolytic plated film 9 is transferred from the electrolytic plating solution to a tank for washing with water. Next, the substrate is washed with acid and immersed in the electrolytic plating solution again. Then, a second layer of electrolytic plated film 9 (second electrolytic plated layer) is formed on the first layer of electrolytic plated film 9.

The above process is repeated multiple times (N times, N is a whole number). An Nth electrolytic plated film 9 (Nth electrolytic plated layer) is formed on the (N−1)th electrolytic plated film 9 ((N−1)th electrolytic plated layer). In the present embodiment, the above process is repeated 14 times. As a result, 14 layers of electrolytic plated film 9 are formed on the seed layer. As shown in FIG. 2, the thickness of laminated electrolytic plated layer 10 is less at edge (E) of penetrating hole 4 than that of electrolytic plated layer 10 at center portion (C) of penetrating hole 4. The tips of the 14th layer of electrolytic plated film 9 touch each other at junction (A). Accordingly, penetrating hole 4 is closed. First recessed portion (R1) is formed on the first-surface (F) side of insulative resin substrate 1, and second recessed portion (R2) is formed on the second-surface (S) side of insulative resin substrate 1.

As shown in FIGS. 1 and 2, the thickness of the center portion of the Nth layer of electrolytic plated film 9 (electrolytic plated layer) is greater than the thickness of the center portion of the (N−1)th layer of electrolytic plated film 9 (electrolytic plated layer). The thickness of the center portion of the uppermost layer of electrolytic plated film 9 (electrolytic plated layer) is greater than the thickness of the center portion of any other layer of electrolytic plated film 9 (electrolytic plated layer).

Penetrating hole 4 is closed by the uppermost layer of electrolytic plated film 9 (electrolytic plated layer). As shown in FIG. 3, when the number N is 7, the uppermost layer of electrolytic plated film 9 is the 7th layer of electrolytic plated film 9. When the thickness of the plating at the center is great, the tip of the uppermost layer of electrolytic plated film 9 tends to be pointing. Thus, two tips touch each other, thereby closing penetrating hole 4. If the number N is greater, the slope near the tip of the uppermost layer of electrolytic plated film 9 tends to be gradual. Accordingly, the reliability of the through-hole conductor according to the present embodiment is high.

Also, when the Nth layer of electrolytic plated film 9 is the uppermost layer of the electrolytic plated film, the difference is the maximum between the thickness of the center portion of the Nth layer of electrolytic plated film 9 and the thickness of the center portion of the (N−1)th layer of electrolytic plated film 9. By reducing such difference, the slope is made gradual. By increasing the value of N, the difference is made smaller. When the value of N is 10 or greater, (that is, the number of layers of electrolytic plated film 9 is 10 or greater), the reliability of the through-hole conductor is likely to increase.

To form electrolytic plated film 9, examples of the composition of an electrolytic copper plating solution and the temperature for plating are respectively shown below.

In addition, since laminated electrolytic plated layer 10 has multiple layers of electrolytic plated film 9, the diameter of crystalline particles of laminated electrolytic plated layer 10 is finer than those in first and second filled electrolytic plated layers (11, 12) (see FIG. 1). Because of the finer particle diameter, cracking tends not to occur in laminated electrolytic plated layer 10.

Laminated electrolytic plated layer 10 is also formed on metal foil 6.

Electrolytic Copper Plating Solution

| sulfuric acid | 0.5 mol/L |
|---|---|
| copper sulfate | 0.8 mol/L |
| iron sulfate | 5 g/L |
| leveling agent | 50 mg/L |
| polishing agent | 50 mg/L |

Conditions for Electrolytic Copper Plating
temperature 34±2° C.

(4) Next, first and second filled electrolytic plated layers (11, 12) are respectively formed in first recessed portion (R1) and second recessed portion (R2). First and second recessed portions (R1, R2) are filled with electrolytic copper plating.

Examples of the composition of an electrolytic copper plating solution and conditions are respectively shown below.

Electrolytic Copper Plating Solution

| sulfuric acid | 2.24 mol/L |
|---|---|
| copper sulfate | 0.26 mol/L |
| iron sulfate | 19.5 ml/L |
| leveling agent | 50 mg/L |
| polishing agent | 50 mg/L |

Conditions for Electrolytic Copper Plating

| current density | 1 A/dm$^2$ |
|---|---|
| time | 15 minutes |
| temperature | 22 ± 2° C. |

First and second filled electrolytic plated layers (11, 12) are formed continuously under constant conditions. In addition, since the distances from the edges of penetrating hole 4 to the bottoms of first and second recessed portions (R1, R2) are each short, the plating solution is fully supplied. Thus, the diameter of crystalline particles in first and second filled electrolytic plated layers (11, 12) tends to be greater than the diameter of crystalline particles in each layer of electrolytic plated film 9 (electrolytic plated layer) that makes up laminated electrolytic plated layer 10 (see FIG. 1). The deposition speed of first and second filled electrolytic plated layers (11, 12) is faster than the deposition speed of electrolytic plated film 9. First and second filled electrolytic plated layers (11, 12) are also formed on laminated electrolytic plated layer 10 on insulative resin substrate 1.

(5) Etching resist is formed on first and second filled electrolytic plated layers (11, 12).

(6) First and second filled electrolytic plated layers (11, 12), laminated electrolytic plated layer 10, electroless plated layer 7 and metal foil 6, which are exposed from the etching resist, are removed by etching.

(7) The etching resist is removed. Accordingly, the core substrate (printed wiring board) shown in FIG. 2 is completed.

First and second filled electrolytic plated layers (11, 12) are formed using direct-current plating. However, first and second filled electrolytic plated layers (11, 12) may also be formed by pulse-current plating. The heights of first and second filled electrolytic plated layers (11, 12) formed in first and second recessed portions (R1, R2) are preferred to be set at the same heights of first and second conductive layers (2, 3) respectively. When the top surfaces (opposite the bottom surfaces) of the plated layers in first and second filled plated layers (11, 12) reach substantially the same level as first surface (F) and second surface (S) respectively, it indicates first and second recessed portions (R1, R2) are filled. A buildup layer can be formed on the core substrate.

To reduce the resistance of a through-hole conductor and to decrease the diameter of the penetrating hole for a through-hole conductor, the penetrating hole for a through-hole conductor may be filled with plating.

When electrolytic plating is deposited from a side wall of a penetrating hole for a through-hole conductor (through hole) toward the center axis of the through hole, and a predetermined portion of the through hole is closed by plating, the tips of plated film growing from the side wall of the through hole may touch each other at the predetermined position. When stress is exerted on the through hole, it is thought that the stress tends to concentrate on the touching portion. Especially, when protruding plated films or the tip portions of the plated film touch each other, it is thought that the stress at such a portion is likely to grow. Therefore, the reliability of such a through-hole conductor is likely to decrease. For example, stress is thought to cause cracking in the through-hole conductor.

It is difficult to fill a penetrating hole for a through-hole conductor without experiencing any defects. Thus, reliability tends to be lowered in a through-hole conductor formed by filling a penetrating hole with plating.

A printed wiring board according to an embodiment of the present invention has the following: an insulative resin substrate having a first surface and a second surface opposite the first surface as well as a penetrating hole for a through-hole conductor; a first conductive layer formed on the first surface of the insulative resin substrate; a second conductive layer formed on the second surface of the insulative resin substrate; and a through-hole conductor which is formed in the penetrating hole and connects the first conductive layer and the second conductive layer, and which is made up of a seed layer formed on the inner wall of the penetrating hole, a laminated electrolytic plated layer formed on the seed layer and closing the penetrating hole at approximately the center portion, and a filled electrolytic plated layer formed on the laminated electrolytic plated layer and filling a recessed portion formed by the laminated electrolytic plated layer.

The laminated electrolytic plated layer is made up of multiple layers of electrolytic plated film, the electrolytic plated film is applied layer by layer along the electroless plated layer, and the thickness of the electrolytic plated film at the edge portion is less than the thickness of the electrolytic plated film at approximately the center portion.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an insulative resin substrate having a penetrating hole;
   a first conductive layer formed on a first surface of the insulative resin substrate;
   a second conductive layer formed on a second surface of the insulative resin substrate on an opposite side with respect to the first surface of the insulative resin substrate; and
   a through-hole conductor formed in the penetrating hole of the insulative resin substrate such that the through-hole conductor is connecting the first conductive layer and the second conductive layer,
   wherein the through-hole conductor comprises a seed layer formed on an inner wall of the penetrating hole, a laminated electrolytic plated layer formed on the seed layer and a filled electrolytic plated layer formed on the laminated electrolytic plated layer, the laminated electrolytic plated layer is formed in the penetrating hole such that the laminated electrolytic plated layer is closing a center portion of the penetrating hole and forming a recessed portion at an end portion of the penetrating hole, the filled electrolytic plated layer is formed in the penetrating hole such that the filled electrolytic plated layer is filling the recessed portion of the penetrating hole, the laminated electrolytic plated layer comprises a plurality of electrolytic plated films such that the electrolytic plated films are laminated along the seed layer and that each of the electrolytic plated films has a thickness which is less at an edge portion than at a center portion, and the filled electrolytic plated layer comprises electrolytic plated crystalline particles having a particle diameter which is greater than a particle diameter of electrolytic plated crystalline particles of the laminated electrolytic plated layer.

2. A printed wiring board according to claim 1, wherein the laminated electrolytic plated layer has at least seven layers of the electrolytic plated films.

3. A printed wiring board according to claim 1, wherein the electrolytic plated films of the laminated electrolytic plated layer is in a range of seven layers to less than twenty one layers.

4. A printed wiring board according to claim 1, wherein the laminated electrolytic plated layer has at least ten layers of the electrolytic plated films.

5. A printed wiring board according to claim 1, wherein the first conductive layer includes a metal foil layer, the seed layer formed on the metal foil layer, the laminated electrolytic plated layer formed on the seed layer and the filled electrolytic plated layer formed on the laminated electrolytic plated layer, and the second conductive layer includes a metal foil layer, the seed layer formed on the metal foil layer, the laminated electrolytic plated layer formed on the seed layer and the filled electrolytic plated layer formed on the laminated electrolytic plated layer.

6. A printed wiring board according to claim 2, wherein the first conductive layer includes a metal foil layer, the seed layer formed on the metal foil layer, the laminated electrolytic plated layer formed on the seed layer and the filled electrolytic plated layer formed on the laminated electrolytic plated layer, and the second conductive layer includes a metal foil layer, the seed layer formed on the metal foil layer, the laminated electrolytic plated layer formed on the seed layer and the filled electrolytic plated layer formed on the laminated electrolytic plated layer.

7. A printed wiring board according to claim 1, wherein the seed layer is an electroless plated layer.

8. A method for manufacturing a printed wiring board, comprising:
   forming a penetrating hole through an insulative resin substrate;
   forming a first conductive layer on a first surface of the insulative resin substrate;
   forming a second conductive layer on a second surface of the insulative resin substrate on an opposite side with respect to the first surface of the insulative resin substrate; and
   forming a through-hole conductor in the penetrating hole of the insulative resin substrate such that the through-hole conductor connects the first conductive layer and the second conductive layer, wherein the forming of the through-hole conductor comprises forming a seed layer on an inner wall of the penetrating hole, forming a laminated electrolytic plated layer on the seed layer and forming a filled electrolytic plated layer on the laminated electrolytic plated layer, the laminated electrolytic plated layer is formed in the penetrating hole such that the laminated electrolytic plated layer is closing a center portion of the penetrating hole and forming a recessed portion at an end portion of the penetrating hole, the filled electrolytic plated layer is formed in the penetrating hole such that the filled electrolytic plated layer is filling the recessed portion of the penetrating hole, the forming of the laminated electrolytic plated layer comprises forming a plurality of electrolytic plated films such that the electrolytic plated films are laminated along the seed layer and that each of the electrolytic plated films has a thickness which is less at an edge portion than at a center portion, and the forming of the filled electrolytic plated layer comprises forming electrolytic plated crystalline particles having a particle diameter which is greater than a particle diameter of electrolytic plated crystalline particles of the laminated electrolytic plated layer.

9. A method for manufacturing a printed wiring board according to claim 8, wherein the forming of the laminated electrolytic plated layer comprises forming at least seven layers of the electrolytic plated films.

10. A method for manufacturing a printed wiring board according to claim 8, wherein the forming of the laminated electrolytic plated layer comprises forming at least seven layers of the electrolytic plated films and less than twenty one layers of the electrolytic plated films.

11. A method for manufacturing a printed wiring board according to claim 8, wherein the forming of the laminated electrolytic plated layer comprises forming at least ten layers of the electrolytic plated films.

12. A printed wiring board according to claim 7, wherein the laminated electrolytic plated layer has at least seven layers of the electrolytic plated films.

13. A printed wiring board according to claim 7, wherein the electrolytic plated films of the laminated electrolytic plated layer is in a range of seven layers to less than twenty one layers.

14. A printed wiring board according to claim 7, wherein the laminated electrolytic plated layer has at least ten layers of the electrolytic plated films.

15. A printed wiring board according to claim 14, wherein the first conductive layer includes a metal foil layer, the seed layer formed on the metal foil layer, the laminated electrolytic plated layer formed on the seed layer and the filled electrolytic plated layer formed on the laminated electrolytic plated layer, and the second conductive layer includes a metal foil layer, the seed layer formed on the metal foil layer, the laminated electrolytic plated layer formed on the seed layer and the filled electrolytic plated layer formed on the laminated electrolytic plated layer.

16. A printed wiring board according to claim 5, wherein the seed layer is an electroless plated layer.

17. A printed wiring board according to claim 16, wherein the laminated electrolytic plated layer has at least seven layers of the electrolytic plated films.

18. A printed wiring board according to claim 16, wherein the electrolytic plated films of the laminated electrolytic plated layer is in a range of seven layers to less than twenty one layers.

19. A printed wiring board according to claim 3, wherein the first conductive layer includes a metal foil layer, the seed layer formed on the metal foil layer, the laminated electrolytic plated layer formed on the seed layer and the filled electrolytic plated layer formed on the laminated electrolytic plated layer, and the second conductive layer includes a metal foil layer, the seed layer formed on the metal foil layer, the laminated electrolytic plated layer formed on the seed layer and the filled electrolytic plated layer formed on the laminated electrolytic plated layer.

20. A printed wiring board according to claim 4, wherein the first conductive layer includes a metal foil layer, the seed layer formed on the metal foil layer, the laminated electrolytic plated layer formed on the seed layer and the filled electrolytic plated layer formed on the laminated electrolytic plated layer, and the second conductive layer includes a metal foil layer, the seed layer formed on the metal foil layer, the laminated electrolytic plated layer formed on the seed layer and the filled electrolytic plated layer formed on the laminated electrolytic plated layer.

* * * * *